(12) United States Patent
Matsuda

(10) Patent No.: US 6,720,648 B2
(45) Date of Patent: Apr. 13, 2004

(54) ELECTRONIC DEVICE

(75) Inventor: Hideki Matsuda, Ishikawa-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/230,071

(22) Filed: Aug. 29, 2002

(65) Prior Publication Data

US 2003/0062617 A1 Apr. 3, 2003

(30) Foreign Application Priority Data

Aug. 30, 2001 (JP) ........................................ 2001-261860

(51) Int. Cl.$^7$ ............................................... H01L 23/52
(52) U.S. Cl. ........................ 257/704; 257/678; 257/584; 257/703; 257/710; 257/766
(58) Field of Search ................................. 257/704, 678, 257/584, 703, 710, 766

(56) References Cited

U.S. PATENT DOCUMENTS

| | | | |
|---|---|---|---|
| 5,311,402 A | * | 5/1994 | Kobayashi et al. ......... 361/760 |
| 6,294,408 B1 | * | 9/2001 | Edwards et al. ............. 438/121 |
| 6,437,412 B1 | * | 8/2002 | Higuchi et al. ............. 257/416 |
| 6,437,439 B1 | * | 8/2002 | Shimoe ....................... 257/734 |

\* cited by examiner

*Primary Examiner*—Jasmine Clark
(74) *Attorney, Agent, or Firm*—Keating & Bennett, LLP

(57) ABSTRACT

An electronic device includes a ceramic chip carrier having an opening, a SAW element chip housed in the opening, a Kovar sealing ring, which is bonded to the ceramic chip carrier by using an Ag brazing material or other suitable material such that the Kovar sealing ring encircles the opening, and a Kovar metal cap, which is placed on the Kovar sealing ring, wherein the Kovar metal cap is coated with Ni-plating which is used as a brazing material for seam-welding and bonding the Kovar metal cap to the Kovar sealing ring and the hermeticity between the metal cap and the sealing ring increases when the thickness of the Ni-plating is about 1 $\mu$m to about 2 $\mu$m.

3 Claims, 5 Drawing Sheets

THICKNESS OF Ni-PLATING OF CAP: 1~2μm

THICKNESS OF Ni-PLATING OF CAP: 3~4μm

ELECTRONIC DEVICE

BACKGROUND OF THE INVENTION

1. Field of the Invention

The present invention relates to an electronic device such as a packaged surface-acoustic-wave (SAW) device, and particularly relates to an electronic device, which has an element chip housed in a ceramic chip carrier and a cap bonded to a sealing ring by using seam welding, thereby achieving hermetic sealing.

2. Description of the Related Art

SAW devices having a packaged SAW element are widely used in many fields, e.g., for filters used for an RF stage or filters used for an IF stage in a mobile communication apparatus. FIG. 1 shows the sectional view of an exemplary packaging configuration of a SAW device (hereinafter referred to as a SAW device 1) as mentioned above, and the configuration thereof will be described below.

The SAW device 1 includes a chip carrier 2 having a base 6, a ceramic layer 7, and a ceramic layer 8, and a SAW element chip 3, a sealing ring 4 having an opening 13, a metal cap 5, a plurality of electrode pads 10, an external electrode 11, a housing space 14 having an opening 9 and an opening 12, and bonding wires 15.

The SAW element chip 3 is hermetically sealed in a package defined by the chip carrier 2, the sealing ring 4, and the metal cap 5. The ceramic layers 7 and 8 are laminated on the base 6 defined by a substantially rectangular ceramic board. The sealing ring 4 is made of Kovar (Fe—Co—Ni alloy) and is placed on the ceramic layer 8, which is the topmost layer. The sealing ring 4 is brazed to the ceramic layer 8 with an Ag brazing material. The surface of the sealing ring 4 is usually coated with primary Ni-plating and top-coat Au plating.

The ceramic layer 7 under the ceramic layer 8 has the opening 9, which has a substantially rectangular shape. The plurality of electrode pads 10 is disposed on the ceramic layer 7. The external electrode 11 extends from the ends of the electrode pads 10 over the sides of the ceramic layer 7 and the base 6, and to the bottom surface of the base 6. Generally, the electrode pads 10 and the external electrode 11 are made of a W (tungsten)-metallized electrode coated with primary Ni-plating and top-coat Au plating. The ceramic layer 8 on the ceramic layer 7 also has the opening 12, which has a substantially rectangular shape. Thus, the chip carrier 2 has the housing space 14 formed by the openings 9 and 12 of the ceramic layers 7 and 8. The sealing ring 4 also has the opening 13 formed therein, which has a substantially rectangular shape.

The SAW element chip 3 is housed in the housing space 14, and is fixed to the top surface of the base 6 within the housing space 14 by using an adhesive. Predetermined electrodes of the SAW element chip 3 are electrically connected to the electrode pads 10 by using the bonding wires 15. Subsequently, the electrodes of the SAW element chip 3 are electrically connected to the outside through the external electrode 11.

After the SAW element chip 3 is mounted in the chip carrier 2, the metal cap 5 for sealing is placed on the sealing ring 4 and is seam-welded thereto. Subsequently, the opening 13 is hermetically sealed by the metal cap 5. The metal cap 5 mainly consists of Kovar as does the sealing ring 4, and the surface thereof is coated with Ni-plating. The thickness of the Ni-plating is relatively large and may be as much as 3 µm or more.

Kovar is a metal that has a thermal coefficient of expansion which is similar to that of ceramic. Therefore, the use of Kovar as a main material of the sealing ring 4 and the metal cap 5 can prevent distortion of the chip carrier 2 or a stress crack due to the expansion differences between the sealing ring 4, the metal cap 5, and the chip carrier 2, which may occur in the course of cooling during or after welding.

The base 6, the ceramic layers 7 and 8, and the electrode pads 10 are simultaneously fired and are integrated to define the chip carrier 2. Since the sealing ring 4 is brazed to the top surface of the chip carrier 2 by using the Ag brazing material, the hermeticity between the chip carrier 2 and the sealing ring 4 is maintained. The metal cap 5 is placed on the sealing ring 4 and is seam-welded thereto by using the Ni-plating of the metal cap 5 as the brazing material, whereby the hermeticity between the sealing ring 4 and the metal cap 5 is provided. Since the SAW element chip 3 is hermetically sealed in the package defined by the chip carrier 2, the sealing ring 4, and the metal cap 5 in the above-described manner, the water resistance and the moisture resistance of the SAW device 1 are ensured. Since the metal cap 5 is bonded to the sealing ring 4 by using the Ni-plating of the metal cap 5 without using any other brazing materials, the bonding cost is reduced, and variation of bonding due to application variation of the brazing material is eliminated.

FIG. 2 shows another known SAW device having a package with a configuration that is different from that in the case of the SAW device 1. In this case, the SAW element chip 3 is mounted with its face down, and bumps 16 are electrically connected to electrode pads 17 on the base 6.

In the SAW device 1 shown in FIG. 1, seam-welding is used as to weld the metal cap 5 to the sealing ring 4 so as to achieve hermetic sealing. FIG. 3 illustrates how the metal cap 5 is seam-welded to the sealing ring 4. As shown in this drawing, the metal cap 5 is placed on the sealing ring 4 on the chip carrier 2 in which the SAW element chip 3 is mounted, and a pair of roller electrodes 18a and 18b is placed so as to come in contact with the outer edge of the metal cap 5. Then, welding currents I1+I2 from an alternating-current (AC) power supply pass between the roller electrodes 18a and 18b, which roll and move around the perimeter of the metal cap 5. Since Joule's heat is generated when the roller electrodes 18a and 18b move around the perimeter of the metal cap 5, the plating of the sealing ring 4 and the Ni-plating of the metal cap 5 are melted and function as brazing materials. Thus, the perimeter of the metal cap 5 is welded to the sealing ring 4, and high hermeticity of the package is achieved.

However, in the above-described cases of the known SAW devices, slight fluctuations of the condition of the welding machines for seam-welding and individual differences between chip carriers can compromise hermeticity of the SAW devices, and can deteriorate yields and reliability for manufacturing the SAW devices.

SUMMARY OF THE INVENTION

In order to overcome the problems described above, preferred embodiments of the present invention provide an electronic device, which has an element chip housed in a ceramic chip carrier, a sealing ring provided on the ceramic chip carrier, and a Ni-plated cap welded to the sealing ring so as to close the element chip, and to achieve sufficient hermeticity between the sealing ring and the Ni-plated cap.

According to a preferred embodiment of the present invention, an electronic device includes a ceramic chip carrier having a recess, an element chip provided in the recess, a metal sealing ring which is bonded to the ceramic chip carrier such that the metal sealing ring surrounds an opening of the recess of said ceramic chip carrier, and a metal cap closing the metal sealing ring to hermetically seal the recess, the metal cap being coated with Ni-plating having a thickness of about 1 μm to about 2 μm for bonding the metal cap to the metal sealing ring.

Preferably, the metal cap of the electronic device is seam-welded to the metal sealing ring by the Ni-plating, which is used as a brazing material.

When the thickness of the Ni-plating is as thin as about 1 μm to 2 μm, the metal cap and the metal sealing ring are firmly bonded, and the hermeticity, the water resistance, and the moisture resistance therebetween are greatly improved. Accordingly, a SAW device with high reliability can be manufactured. Further, still higher hermeticity can be achieved by electroless plating.

Other features, elements, characteristics and advantages of the present invention will become more apparent from the following detailed description of preferred embodiments thereof with reference to the attached drawings.

DETAILED DESCRIPTION OF PREFERRED EMBODIMENTS

Figure 1:
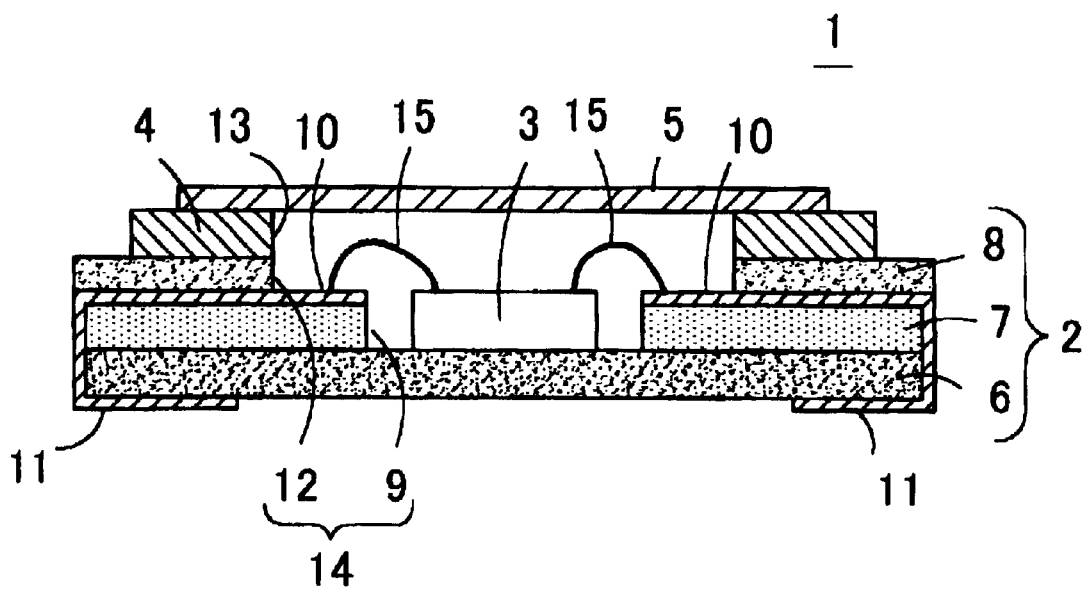
FIG. 1 is a sectional view of a SAW device having a package.

Preferred embodiments of the present invention will now be described. However, a SAW device of the present invention will not be illustrated in drawings for simplicity since the configuration thereof is substantially the same as in the case of the known SAW device shown in FIG. 1. The description will be focused on the difference between the SAW device of preferred embodiments of the present invention and the known SAW device, and like elements will be described using like reference numerals used in FIG. 1.

Figure 2:
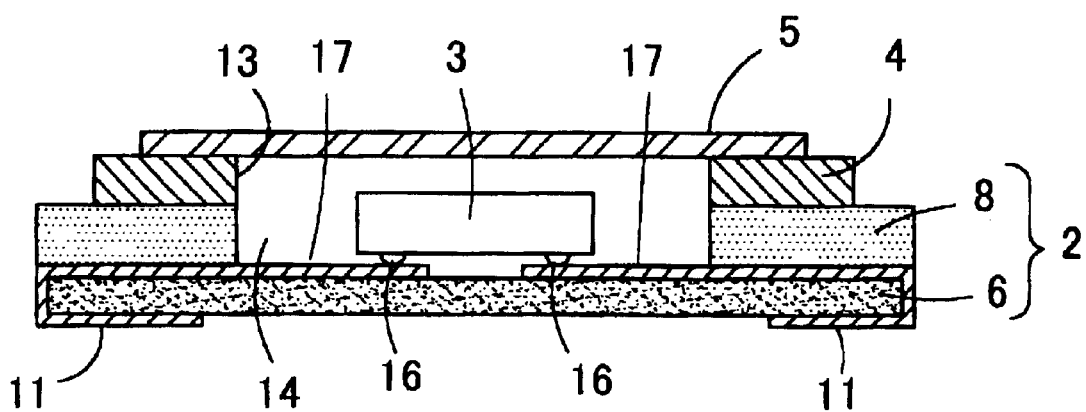
FIG. 2 is a sectional view of another SAW device having a package different from that of the SAW device shown in FIG. 1.

Incidentally, the SAW element chip 3 shown in FIG. 2, which is mounted with its face down, can be used for the SAW device of preferred embodiments of the present invention. Further, the seam-welding illustrated in FIG. 3 as a way for bonding the metal cap 5 to the sealing ring 4 can also be applied to the SAW device of preferred embodiments of the present invention. Therefore, the seam-welding will also be described by using FIG. 3 and like characters and numerals.

As has been described in the known examples, slight fluctuations of the condition of the welding machine for seam-welding the metal caps 5 to the sealing rings 4 and individual differences between chip carriers 2 can compromise hermeticity of the SAW devices, and can deteriorate yields and reliability for manufacturing the SAW devices. To these ends, the thickness of the Ni-plating of the metal cap 5 made of Kovar becomes the main issue of preferred embodiments of the present invention.

Figure 3:
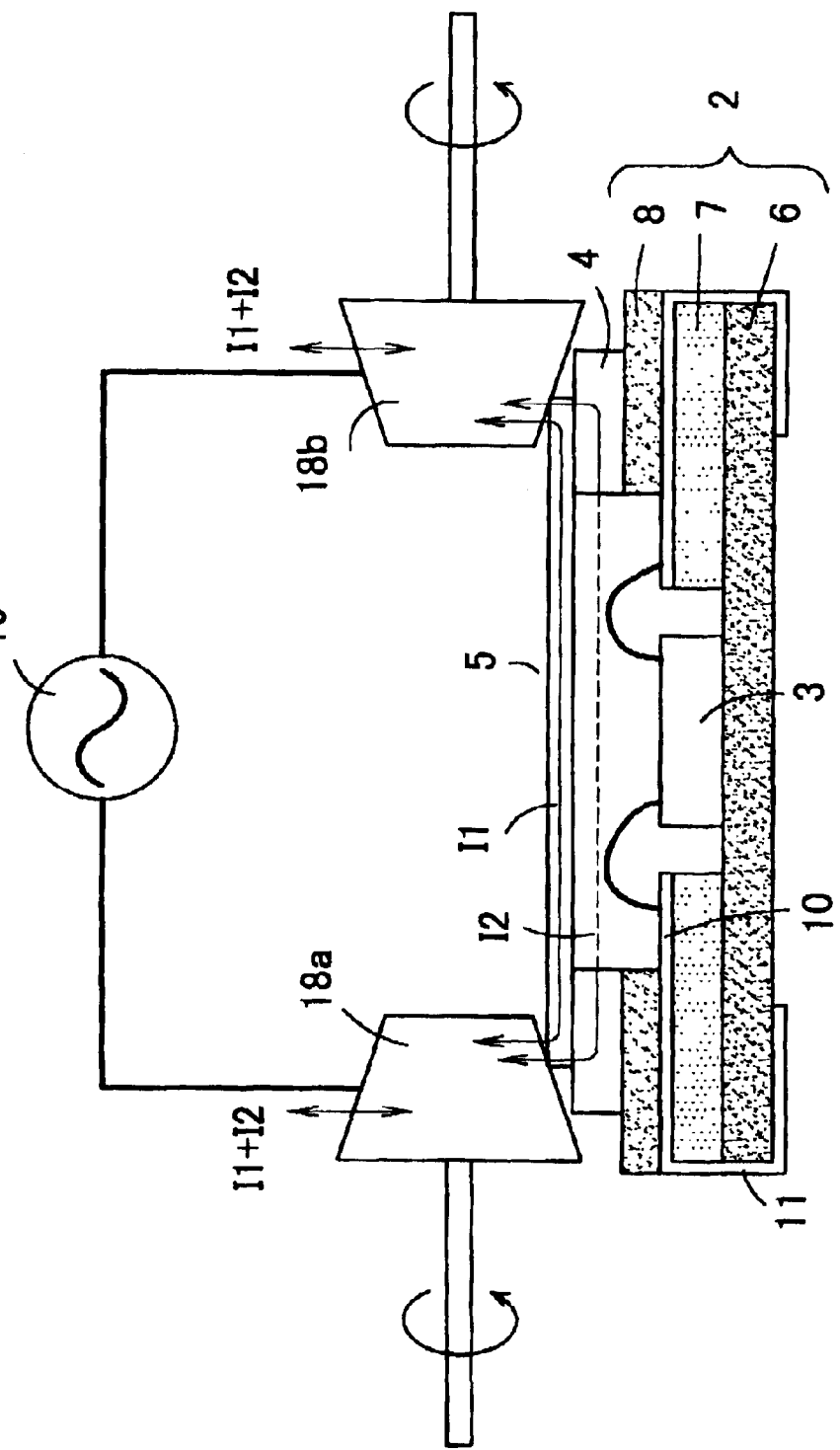
FIG. 3 schematically illustrates how to seam-weld a metal cap to a sealing ring of the SAW device shown in FIG. 1 by using a welding machine.

As shown in FIG. 3, the welding current I1 flows from the roller electrode 18a (or from the roller electrode 18b), passes through the metal cap 5, and flows to the roller electrode 18b (or the roller electrode 18a). On the other hand, the welding current I2 flows from the roller electrode 18a (or from the roller electrode 18b), passes through the metal cap 5 and the sealing ring 4, again passes through the metal cap 5 and flows out of the roller electrode 18b (or the roller electrode 18a). It is believed that the welding current I2 affects the hermeticity between the sealing ring 4 and the metal cap 5, that is, the weldability. Accordingly, as the welding current I2 increases, Joule's heat generated at the interface between the metal cap 5 and the sealing ring 4 also increases. The increased Joule's heat promotes melting of the Ni-plating and the weldability, thereby increasing the hermeticity.

When the welding current I2 increases, however, the welding current I1 needs to relatively decrease, since the welding currents I1 and I2 are constant for one welding condition of the welding machine. The welding current I1 can be decreased by increasing the electric resistance of the part where the welding current I1 flows. The electric resistance can be increased by decreasing the thickness of the Ni-plating of the metal cap 5. Subsequently, it is assumed that the hermeticity of the SAW device can be increased by decreasing the thickness of the Ni-plating coating the metal cap 5.

To verify the above assumption, three groups of metal caps 5 made of Kovar coated with Ni-plating were prepared. Each group contains welding conditions. The thickness of the Ni-plating of the first group is about 1 μm to about 2 μm, the second group is about 3 μm to about 4 μm, and the third group is about 5 μm to about 6 μm. Further, four different welding conditions are applied to the metal caps 5 of the three groups. In this manner, the metal caps 5 are seam-welded to the sealing rings 4, whereby SAW devices are formed. The fine-leak-rate distribution of these SAW devices will be illustrated with reference to FIGS. 4, 5, and 6.

Figure 4:
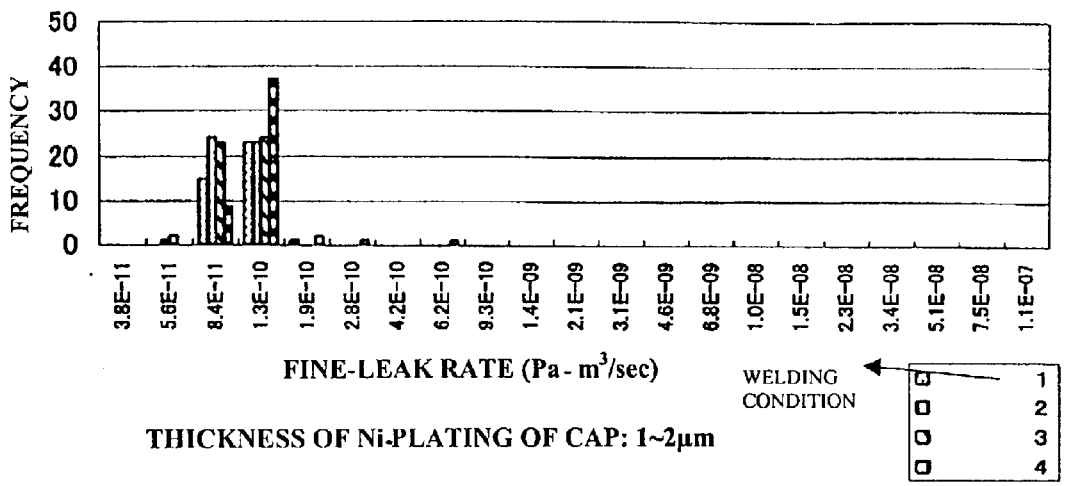
FIG. 4 illustrates fine-leak-rate distribution of SAW devices having a metal cap coated with Ni-plating having a thickness of about 1 μm to about 2 μm.
Figure 5:
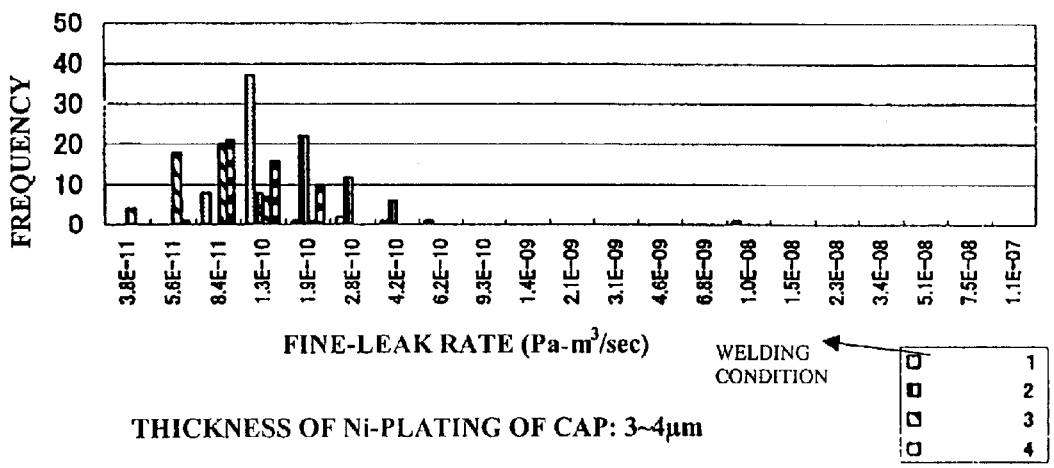
FIG. 5 illustrates fine-leak-rate distribution of SAW devices having a metal cap coated with Ni-plating having a thickness of about 3 μm to about 4 μm.
Figure 6:
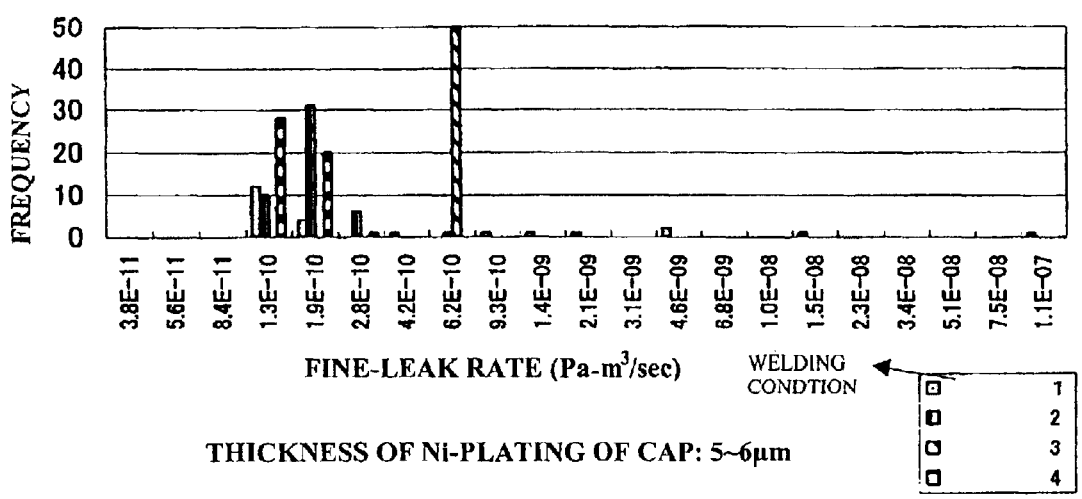
FIG. 6 illustrates fine-leak-rate distribution of SAW devices having a metal cap coated with Ni-plating having a thickness of about 5 μm to about 6 μm.

FIG. 4 illustrates the fine-leak-rate distribution of the metal caps 5 of the first group. FIG. 5 illustrates the fine-leak-rate distribution of the metal caps 5 of the second group. FIG. 6 illustrates the fine-leak-rate distribution of the metal caps 5 of the third group. It should be noted that the letters "E" shown in FIGS. 4 to 6 represent an exponential. For example, 3.8E-11 refers to $3.8 \times 10^{-11}$.

Incidentally, the fine-leak rate is a measure showing the level of hermeticity, which is legislated as an official standard such as JIS. When a sample is enclosed in a high-pressure He gas for a predetermined time and the hermeticity of the sample is perfect, the He gas does not enter the sample. However, when the hermeticity is damaged in the slightest way, the sample is filled with the He gas. Then, the sample is placed in a container having a He detector, and the container is evacuated. Since the He gas leaks through the sample during the evacuation, the flow amount of the He gas can be measured. Thus, the leakage of the He gas can be quantitatively measured, whereby the fine-leak rate is obtained.

FIGS. 4 to 6 give a comparison among the fine-leak-rate distribution of the three groups of metal caps 5. As shown by the drawings, the variation of the fine-leak rate increases as the thickness of the Ni-plating increases. In the first group where the thickness of the Ni-plating is about 1 $\mu$m to about 2 $\mu$m, the hermeticity of all of the samples is high as much as approximately $1 \times 10^{-9}$ Pa·m$^3$/sec or less. In the second group where the thickness of the Ni-plating is about 3 $\mu$m to about 4 $\mu$m, the hermeticity of one of the samples is approximately $1 \times 10^{-7}$ Pa·m$^3$/sec. Further, in the third group where the thickness of the Ni-plating is about 5 $\mu$m to about 6 $\mu$m, the hermeticity of one of the samples is approximately $1 \times 10^{-7}$ Pa·m$^3$/sec.

As has been described, the metal cap 5 is seam-welded to the sealing ring 4 preferably using the Ni-plating as the brazing material. However, FIGS. 5 and 6 show that the hermeticity of the SAW device decreases as the thickness of the Ni-plating of the metal cap 5 increases.

Figure 7:
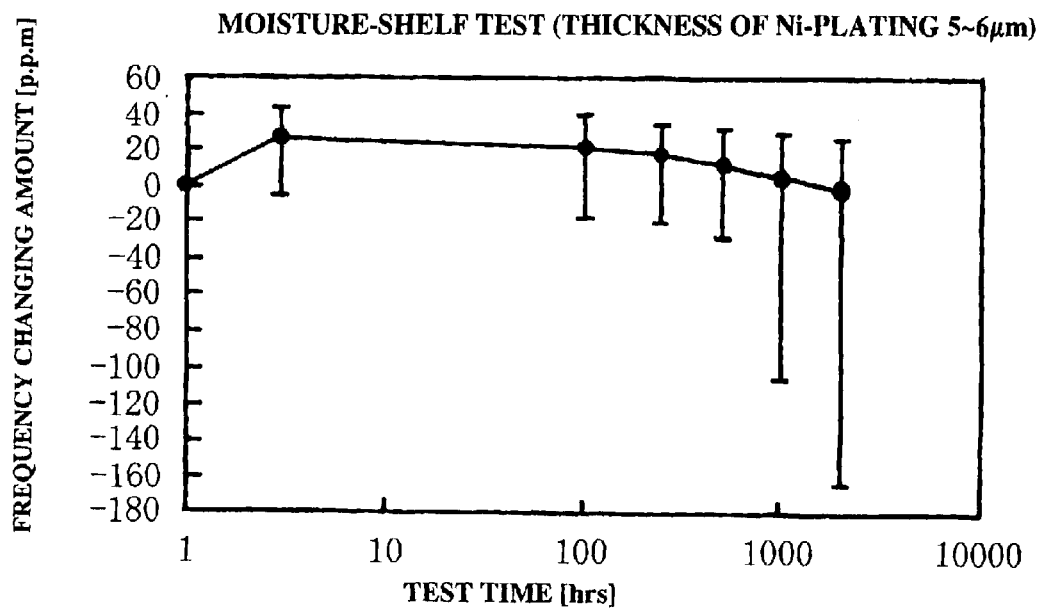
FIG. 7 illustrates frequency changing amounts of the SAW devices having the metal cap coated with the Ni-plating having the thickness of about 5 μm to about 6 μm during a moisture shelf test.
Figure 8:
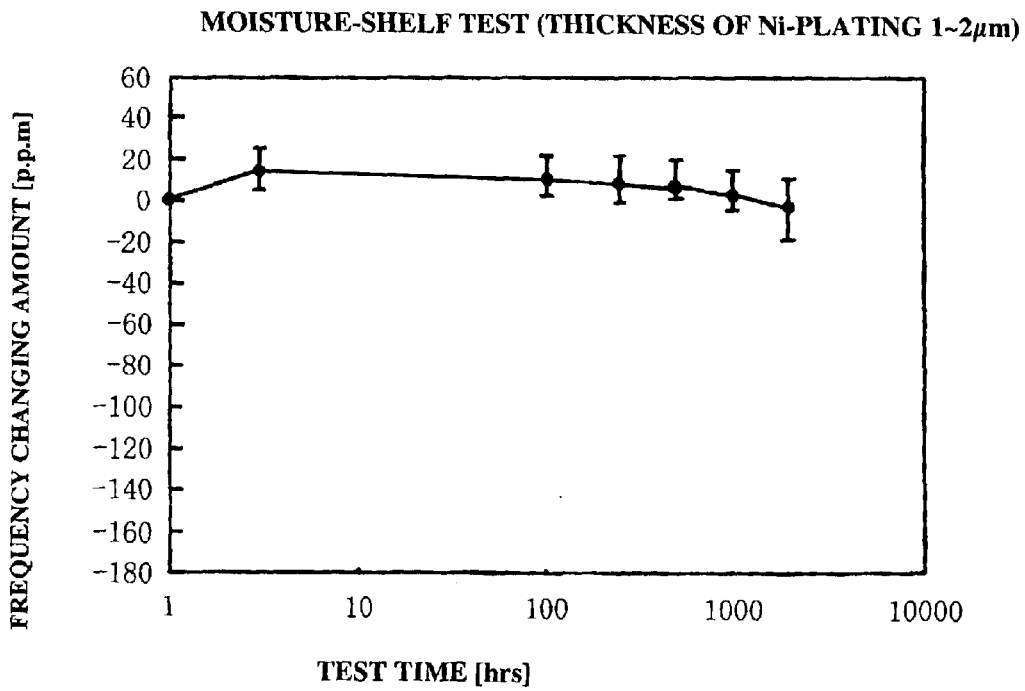
FIG. 8 illustrates frequency changing amounts of the SAW devices having the metal cap coated with the Ni-plating having the thickness of about 1 μm to about 2 μm during a moisture shelf test.

FIGS. 7 and 8 show the results of moisture shelf tests (at a temperature of about 60° C. and at a humidity of about 95%) carried out on the third group of metal caps 5 and the first group of metal caps 5.

More specifically, FIG. 7 shows frequency changing amount of the SAW devices of the third group during the moisture shelf tests. Likewise, FIG. 8 shows frequency changing amount of the SAW devices of the first group during the moisture shelf tests.

As shown in FIG. 7, the frequency of some of the third group where the thickness of the Ni-plating is about 5 $\mu$m to about 6 $\mu$m is significantly lowered after 1000 hours, since the hermeticity between the metal cap 5 and the sealing ring 4 is not sufficient. Subsequently, some water enters the SAW device, thereby corroding the electrodes therein. On the other hand, the frequency lowering amount of the first group remained at about −20 p.p.m after 2000 hours. This clearly shows that the hermeticity between the metal cap 5 and the sealing ring 4 can be increased by decreasing the thickness of the Ni-plating of the metal cap 5 to about 1 $\mu$m to about 2 $\mu$m.

Accordingly, it has been verified that, in a SAW device including (i) a chip carrier having a flat-shaped first ceramic layer and at least one second ceramic layer, which is laminated on the first ceramic layer and has an opening, (ii) a sealing ring made of Kovar laminated on the second ceramic layer, (iii) a SAW element chip mounted in a housing space formed by the opening of the chip carrier, and (iv) a cap made of Kovar for hermetically sealing the opening of the sealing ring, the hermeticity between the cap and the sealing ring can be increased by coating the cap with Ni-plating having a thickness of about 1 $\mu$m to about 2 $\mu$m.

Further, it is preferable that the metal cap 5 is coated with electroless Ni-plating. By using electroless plating wherein the melting point is lower than in the case of the electrolytic plating due to phosphorus (P) contained in the reducing agent thereof, it becomes possible to melt the Ni-plating by a relatively small welding current. Thus, the welding conditions can be relaxed, whereby the thermal stress accompanied by the welding and-occurrence of a crack in the package resulting therefrom can be reduced. Another advantage of using electroless Ni-plating is that thickness unevenness the surface of the plating is smaller than in the case of the electrolytic Ni-plating. It clearly shows that the current distribution during welding, that is, the welding variation is smaller than in the case of electrolytic plating. Accordingly, problems that arise in the SAW device due to the poor hermeticity are reduced.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. An electronic device comprising:
    a ceramic chip carrier having a recess;
    an element chip provided in the recess of the ceramic chip carrier;
    a metal sealing ring, which is bonded to the ceramic chip carrier such that the metal sealing ring surrounds an opening of the recess of said ceramic chip carrier; and
    a metal cap closing an opening of the metal sealing ring to hermetically seal the recess, said metal cap being coated with an Ni-plating having a thickness of about 1 $\mu$m to about 2 $\mu$m for bonding the metal cap to the metal sealing ring; wherein
    said Ni-plating is directly bonded to the metal sealing ring.

2. An electronic device according to claim 1, wherein the metal cap is seam-welded to the metal sealing ring by the Ni-plating.

3. An electronic device according to claim 1, wherein the Ni-plating is an electroless plated member.

* * * * *